(12) United States Patent
Murata

(10) Patent No.: US 7,015,495 B2
(45) Date of Patent: Mar. 21, 2006

(54) METALLIC VERY THIN FILM, METALLIC VERY THIN FILM MULTILAYER BODY, AND METHOD FOR MANUFACTURING THE METALLIC VERY THIN FILM OR THE METALLIC VERY THIN FILM LAMINATE

(75) Inventor: Yoshitada Murata, Saitama (JP)

(73) Assignee: Nippon Sheet Glass Co., Japan, Osaka (JP)

( * ) Notice: Subject to any disclaimer, the term of this patent is extended or adjusted under 35 U.S.C. 154(b) by 46 days.

(21) Appl. No.: 10/471,696

(22) PCT Filed: Mar. 15, 2002

(86) PCT No.: PCT/JP02/02490

§ 371 (c)(1),
(2), (4) Date: Sep. 15, 2003

(87) PCT Pub. No.: WO02/075026

PCT Pub. Date: Sep. 26, 2002

(65) Prior Publication Data

US 2004/0104472 A1    Jun. 3, 2004

(30) Foreign Application Priority Data

Mar. 16, 2001 (JP) .............................. 2001-076788

(51) Int. Cl.
*H01L 29/06* (2006.01)
*H01L 21/443* (2006.01)

(52) U.S. Cl. .......................................... 257/9; 438/679
(58) Field of Classification Search ............... 438/3, 438/679, 680, 681, 686, 687; 257/9, 28, 257/30; 118/715
See application file for complete search history.

(56) References Cited

U.S. PATENT DOCUMENTS 6,503,330 B1 * 1/2003 Sneh et al. ............... 118/715

(Continued)

FOREIGN PATENT DOCUMENTS

JP         62-87820 A      4/1987

(Continued)

OTHER PUBLICATIONS

Frank, Martin et al; Surface Science; May 2000; pp. 968-973; vols. 454-456.

(Continued)

*Primary Examiner*—Carl Whitehead, Jr.
*Assistant Examiner*—Jennifer M Dolan
(74) *Attorney, Agent, or Firm*—Birch, Stewart, Kolasch & Birch, LLP

(57) ABSTRACT

The present invention relates to an ultra-thin metal film, an ultra-thin metal multilayer film, and a method of fabricating an ultra-thin metal film or an ultra-thin metal multilayer film. The ultra-thin metal film and the ultra-thin metal multilayer film can be obtained by forming a dielectric film on a conductive base material in a film thickness that causes the significant tunneling effect between metals through the thin dielectric film, or a film thickness whereby the valence electrons and holes of the metal composing the metallic base material and the ultra-thin metal film are affected by the many-body effects, for example, in a film thickness wherein the band-gap width of said dielectric is narrowed; and the ultra-thin metal films are formed on the dielectric grown in the layer-by-layer mode by the deposition method. According to the present invention, an ultra-thin metal film or a film wherein ultra-thin metal films are multilayered can be obtained without forming clusters, and the present invention can be applied for the extension of the life of catalysts, the densification of integrated circuits and the like.

29 Claims, 11 Drawing Sheets

U.S. PATENT DOCUMENTS

2002/0076837 A1 * 6/2002 Hujanen et al. ............... 438/3

FOREIGN PATENT DOCUMENTS

| | | |
|---|---|---|
| JP | 62-87829 A | 4/1987 |
| JP | 2000-211998 A | 8/2000 |

OTHER PUBLICATIONS

Magkoev, T.T. et al; Physical Status Solidi B; Jan. 2001; pp. 3-5; vol. 223 No. 2.
Frederick, B.G. et al; Surface Science; Mar. 1991; pp. 67 to 80; vol. 244; No. 1/2.

* cited by examiner (a)

(b)

RAIRS spectra for CO adsorbed on Pt(5ML)/SiO$_2$(40Å)/Ni(111)

(a): Adsorption onto Pt (111) face
(b): Adsorption onto Pt (111)-Ge face

Bridge

On top

METALLIC VERY THIN FILM, METALLIC VERY THIN FILM MULTILAYER BODY, AND METHOD FOR MANUFACTURING THE METALLIC VERY THIN FILM OR THE METALLIC VERY THIN FILM LAMINATE

This application is the national phase under 35 U.S.C. § 371 of PCT International Application No. PCT/JP02/02490 which has an International filing date of Mar. 15, 2002, which designated the United States of America.

TECHNICAL FIELD

The present invention relates to an ultra-thin metal film, an ultra-thin metal multilayer film, and a method of fabricating an ultra-thin metal film or an ultra-thin metal multilayer film.

BACKGROUND ART

It is a well-known phenomenon that a transition metal grows in an island shape when it is deposited on the surface of a single-crystal oxide (Vollmer-Weber mode).

Japanese Patent Laid-Open No. 62-87820 discloses, as a sample for infrared absorption analysis, what is deposited Pt (platinum) as a first thin film partially transmitting infrared beams is deposited on one low-index surface of a single-crystal silicon substrate, and then a second thin film to be the sample is deposited on the first thin film (Pt).

This sample for infrared absorption analysis has an enhanced reliability of information such as molecular orientation by making the thickness of the first thin film (Pt) to a thickness partially transmitting infrared beams so that the same sample can be used for both measurement methods of the transmission method and the reflection method.

In the description, as specific thickness of the above-described first thin film (Pt), a thickness of 50 to 200 angstroms is described, and in the example, a thin Pt film of 100 angstroms is formed.

As described above, when a transition metal such as Pt is deposited on the surface of a single-crystal oxide, Pt is first deposited in an island shape on the single-crystal oxide (hereafter, this deposit is referred to as cluster), and the cluster is gradually densified to be a continuous film (thin film).

Since a Pt cluster is an aggregation of Pt atoms, and has a diameter of about 30 nm (300 angstroms) and a thickness of 6 to 8 nm (60 to 80 angstroms), films thinner than this cannot be formed. The description of the above-described patent also supports this fact.

DISCLOSURE OF THE INVENTION

The object of the present invention is to obtain an ultra-thin metal film that has neither been obtained naturally nor artificially.

If an ultra-thin film of a metal, such as Pt, Pd, Ni, Ti, Au, Ag, Cu, Al and Zn, can be formed on an insulator, not only the quantities of the metals used as catalysts can be reduced, but also the mechanism of the activity of catalysts, or the mechanism of photochemical reactions can be clarified by electron transition.

The ultra-thin metal film according to the present invention has a structure wherein one atom in thickness forms a two-dimensionally continuous film, and the thickness thereof is 3 nm or less, and specifically bout 0.2 nm.

The present inventor obtained findings that when the film thickness of a thin film of a dielectric (insulator) is made extremely thin on the metal, the tunneling effect between metals present sandwiching the thin dielectric film occurred easily, and that the valence electrons and holes of the both metals were interacted by the many-body effects.

Specifically, the present inventor verified that the band gap of $\alpha$-$AL_2O_3$ (corundum) narrowed using the electron energy loss spectrum (EELS). Namely, the band gap when the thickness was 3 nm was about 9 eV, while the band gap when the thickness was 1 nm was about 3 eV.

In this connection, although Frederick et al. reported the formation of $\alpha$-$AL_2O_3$ (corundum) on a substrate (Ru) in Surface Science, 244 (1991), the paper did not discuss the effect of the tunneling effect between metals and the many-body effects, and no findings on the band gap narrowing of $\alpha$-$AL_2O_3$ (corundum) were reported.

The phenomenon that the band gap is narrowed when the film thickness of the above-described thin dielectric film is extremely thinned was unpredictable. The present inventor considered that the reason is the many-body effects such as the narrowing of the band gap due to a mirror-image charge, or the tailing effect on the wave function from the substrate (Ru) to the thin oxide film ($\alpha$-$AL_2O_3$).

The present inventor reached the conclusion that if the above-described hypothesis is correct, the energy stabilization caused by the delocalization of electrons (delocalization) overcomes the aggregating force of metal atoms to form no clusters, and an extremely thin metal film can be prepared.

Actually, when $\alpha$-$AL_2O_3$ (corundum) of a thickness of about 1 nm is formed on an Ru (ruthenium) substrate, and when Pt is vapor-deposited on the $\alpha$-$AL_2O_3$ (corundum), an ultra-thin Pt film (monoatomic layered film) is obtained.

Similarly, when $SiO_2$ (considered to be $\beta$-quartz) of a thickness of about 3 nm is formed on an Ni (nickel) substrate, and when Pt is vapor-deposited on the $SiO_2$, an ultra-thin Pt film (5-atom multilayered film) is obtained.

In the present invention, as conductive base materials that exhibit metallic conduction, Ru as well as metals such as Ni, Mo, Ta, Ag and Co, and graphite can be considered; and the conductive base materials that exhibit metallic conduction include those formed on a silicon, ceramic or glass substrate.

As dielectrics (insulators), $Al_2O_3$ as well as $SiO_2$, MgO and AlN can be considered; and single crystals, or oriented polycrystals regularly oriented that exhibit tensor characteristics as in single crystals are preferable. In the examples, the reason why Ru is selected as the conductive materials, and $Al_2O_3$ is selected as the dielectrics is that these have lattice constants close to each other.

As metals composing an ultra-thin metal film formed on a dielectric, metals such as Pt (platinum), Pd (palladium), Ni (nickel), Ti (titanium), Au (gold), Ag (silver), Cu (copper), Al (aluminum), Zn (zinc), Co (cobalt), Mn (manganese), Mo (molybdenum), W (tungsten), Re (rhenium), Ru (ruthenium) and Rh (rhodium); or various alloys such as a Pt—Ru system, a Pt—Pd system, a Pt—Rh system, a Pt—Ni system, a Pt—Cr system, a Pt—Co system, a Pt—Mo system, a Pt—Fe system, an Ni—Mo system, an Ni—Co system, an Ni—Mo—Co system, an Mo—Co system, an Fe—Cr system, a Cu—Zn system, a Cu—Cr system, a Cu—Ni system, a Zn—Cr system, a Zn—Al system, a Cd—Cu system and Cd—Zn system can be considered.

In order to thin the thickness of the thin dielectric (insulator) film to the degree wherein the tunneling effect or the many-body effects occurs, or the degree wherein the band gap is narrowed, for example in the case of $\alpha$-$Al_2O_3$ (corundum), Al is vapor-deposited on the cleaned (0001) face of Ru, oxidized to form $\gamma\text{-}Al_2O_3$, and phase transition of the $\gamma\text{-}Al_2O_3$ forms $\alpha\text{-}Al_2O_3$.

The methods of forming an ultra-thin metal film include vapor deposition, the CVD method and the PVD method.

Furthermore, according to the present invention, ultra-thin metal films can be multilayered. It is estimated that the electrical and metallurgical properties of the multilayer film are totally different from the electrical and metallurgical properties of a conventional thin film formed by aggregating clusters, even if they have the same thickness.

A metal layer can be formed in an island shape using the technique of the present invention. In this case, the surface area of the metal layer, relative to the quantity of the metal which is used, increases so as to be suitable for use as catalysts and the like.

BEST MODE FOR CARRYING OUT THE INVENTION

Figure 1:
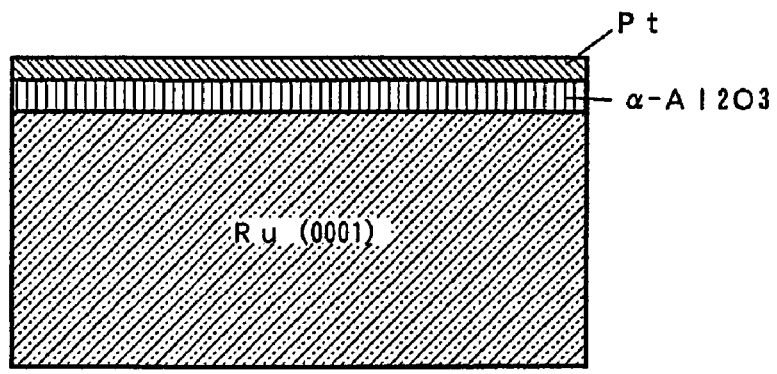
FIG. 1 is a sectional view of a state wherein an ultra-thin metal film according to the present invention is formed on a conductive base material.

As shown in FIG. 1, $\alpha\text{-}Al_2O_3$ (corundum) of a thickness of 1 nm is formed on the (0001) crystal face of an Ru substrate, and the ultra-thin film (monatomic film) of Pt of a thickness of about 0.2 nm (2 angstroms) is formed on the thin $\alpha\text{-}Al_2O_3$ film.

Figure 2:
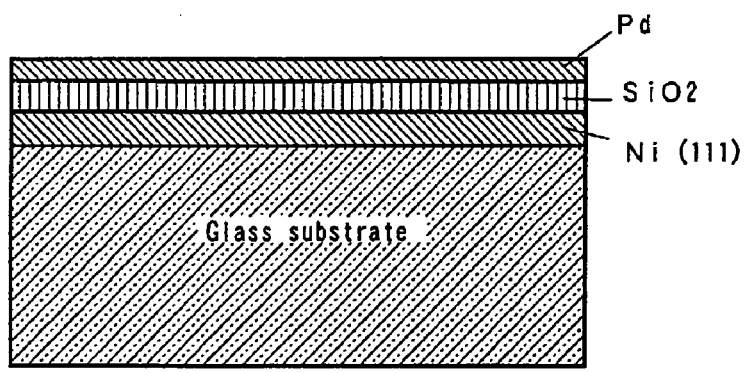
FIG. 2 is a schematic drawing similar to FIG. 1 showing another example.
Figure 3:
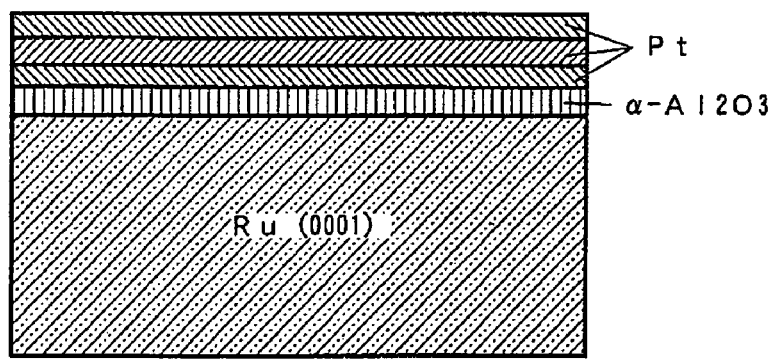
FIG. 3 is a schematic drawing similar to FIG. 1 showing another example.

FIGS. 2 and 3 show other examples, and in the example shown in FIG. 2, an Ni single-crystal layer is formed as a conductive base material on a glass substrate, an $SiO_2$ (β-quartz) of a thickness of 1 nm is formed on the (111) crystal face of the Ni, and an ultra-thin film (monatomic film) of Pd of a thickness of about 0.2 nm (2 angstroms) is formed on the thin $SiO_2$ film. In the example shown in FIG. 3, an ultra-thin film (monatomic film) of Pt is multilayered (layer-by-layer growth) on the $\alpha\text{-}Al_2O_3$ (corundum).

Next, an example of specific fabricating conditions will be described. First, the conditions for forming $\alpha\text{-}Al_2O_3$ (corundum) of a thickness of 3.5 nm or less on the (0001) crystal face of an Ru substrate are as follows:

A thin single-crystal $\alpha\text{-}Al_2O_3$ film was obtained by the phase transition of an amorphous oxide formed on the Ru (0001) face. The Ru (0001) face is a nice candidate as the metal substrate. This is because lattice mismatch between $\alpha\text{-}Al_2O_3$ and Ru (0001) is small, and the melting point of Ru is sufficiently higher than the phase transition temperature of $Al_2O_3$ from the $\gamma$-phase to the $\alpha$-phase. The phase transition temperature from $\gamma\text{-}Al_2O_3$ formed as an oxide to $\alpha\text{-}Al_2O_3$ is about 1,000° C.

An Ru sample of an Ru single-crystal disc was obtained by cutting from a single-crystal rod (6 mm in diameter), whose crystal orientation had been determined by X-ray diffraction, with a diamond-coated wire, and polishing with a water-born alumina powder having a particle diameter of 0.05 $\mu$m. Grooves having a width of 0.3 mm were formed in parallel to the surface on the upper and lower sides of the disc. Short W (tungsten) wires of a diameter of 0.3 mm were inserted into the grooves to set the Ru sample to a sample holder made of tantalum. Heating was performed by passing electric current through the W wires, and the temperature of the Ru sample was measured by a Pt—Pt (Rh) thermocouple attached to the side of the sample, as well as by an optical pyrometer.

The cleaning of the Ru (0001) face was performed by repetition of heating to 950° C. in an oxygen atmosphere (about $3\times10^{-5}$ Pa) and heating to 1,100° C. in vacuum, until the carbon signal with Auger electron spectroscopy disappeared completely. The low-energy electron diffraction (LEED) pattern showed a clear hexagonal symmetry.

After the clear surface was obtained, Al was vapor-deposited on the Ru surface at 400° C., and completely oxidized by gradually elevating the temperature to 1,050° C. in an oxygen atmosphere of $2\times10^{-4}$ Pa.

Since complete oxidation is difficult if the vapor-deposited thickness of Al is thicker than 1 nm, it is stopped to be thinner than 1 nm.

Figure 4:
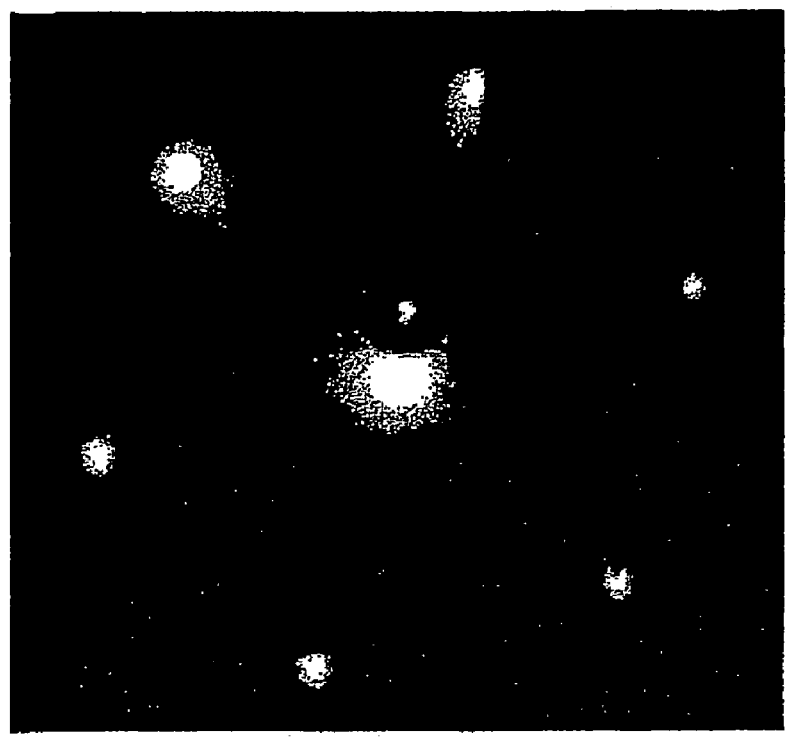
FIG. 4 is a photograph showing a low energy electron diffraction (LEED) pattern of $\alpha\text{-}Al_2O_3$ on Ru (0001) (annealing temperature: 1050° C.)

When metallic Al is not detected by Auger electron spectroscopy, phase transition from $\gamma\text{-}Al_2O_3$ to $\alpha\text{-}Al_2O_3$ is performed. After annealing at 1,050° C. for 20 minutes in an oxygen atmosphere of $2\times10^{-4}$ Pa, a clear 1×1 LEED pattern shown in FIG. 4 was observed. From this 1×1 LEED pattern, the $Al_2O_3$ on Ru (0001) can be determined to be $\alpha\text{-}Al_2O_3$.

Figure 5:
FIG. 5 is a photograph showing a low energy electron diffraction (LEED) pattern of $\gamma\text{-}Al_2O_3$ on Ru (0001) (annealing temperature: 960° C.)

When Al is deposited in a thickness of 1 nm, it is estimated from the signal of Auger electrons that the thickness of the $\alpha\text{-}Al_2O_3$ is about 0.9 nm. If annealing temperature is a little lower than the phase-transition temperature (for example, the annealing temperature is 960° C.), a very complicated LEED pattern as shown in FIG. 5 is observed.

The maximum film thickness of the single-crystal oxide film formed in one time is about 0.9 nm. A sample oxide having a thickness of about 3 nm is obtained by repetition of vapor deposition, oxidation and phase transition due to annealing.

On the other hand, conditions for forming an ultra-thin Pt film on α-Al$_2$O$_3$ (corundum) are as follows:

A Pt wire having a diameter of 0.3 mm wound around a 0.5-mm W (tungsten) wire was used as a Pt source. The ultra-thin Pt film was obtained by heating the W wire. The thickness of Pt was determined by the Pt vapor pressure and the deposition time. The temperature was measured using an optical pyrometer.

The structure of the ultra-thin Pt (platinum) film was verified with images obtained using an Omicron UHV-STM apparatus, and the I-V (current-voltage) curve observed by scanning tunneling spectroscopy (STS).

Figure 6:
FIGS. 6(a) and (b) are photographs showing images by a scanning tunneling microscope (STM); (a) is a photograph showing an image when the bias voltage is −70 meV, and (b) is a photograph showing an image when the bias voltage is +70 meV.
Figure 6:

Auger electron spectroscopy is generally used for the determination of the thickness for ultra-thin films. However, since the Pt signal of Auger electrons overlaps with the signal of Al$^{3+}$ at 55 eV, Auger electron spectroscopy was not used. FIGS. 6(a) and 6(b) show the images of a scanning tunneling microscope obtained with bias voltages of −70 mV and +70 mv, respectively, and ultra-thin Pt films show the structure of a monatomic layer having irregular atomic arrangement.

These agree with the diffraction patterns obtained by low-energy electron diffraction (LEED). The regular structure of the ultra-thin Pt film formed on the α-Al$_2$O$_3$/Ru (0001) face was not observed by low-energy electron diffraction (LEED).

Corrugation corresponding to atomic images is 0.1 nm or less. Circular shapes seen in FIGS. 6(a) and 6(b) are considered to be Pt atoms. Images of light portions and dark portions corresponding to atomic shapes by a scanning tunneling microscope are clearly shown. Both light portions and dark portions are atoms.

By reversing the polarity of the applied bias voltage, the light portions and dark portions are reversed. Atoms shown as light portions at −70 meV are shown as dark portions at +70 meV. Atoms shown as dark portions at −70 meV are shown as light portions at +70 meV. That is, the voltage reversal reverses light and dark portions. This suggests that charge density waves are present in the ultra-thin Pt film.

Figure 7:
FIG. 7 is a scanning tunneling microscope (STM) image of an ultra-thin metal film according to the present invention.
Figure 8:
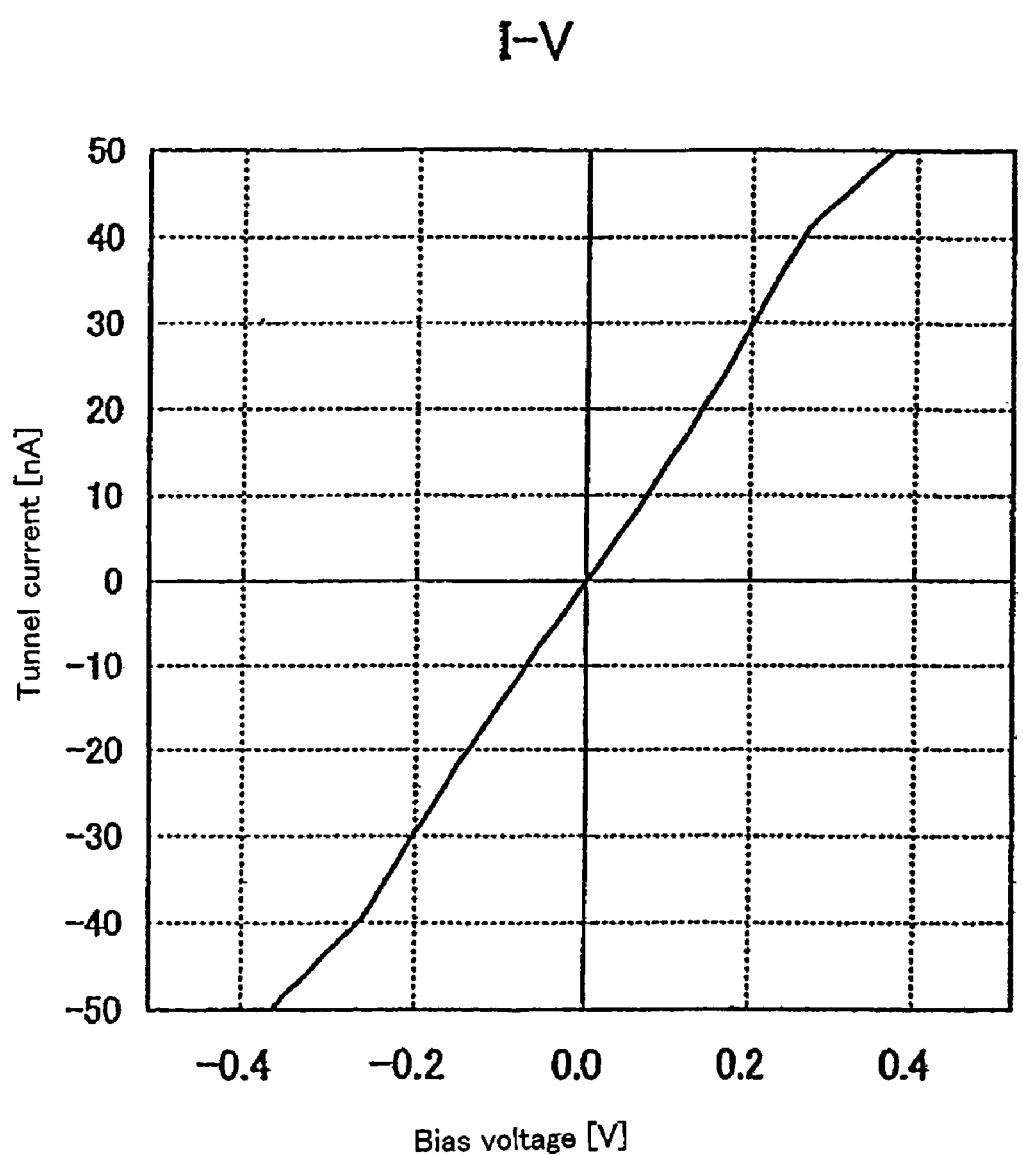
FIG. 8 is an I-V curve of an ultra-thin metal film according to the present invention.

FIG. 7 is a scanning tunneling microscope (STM) image of an ultra-thin metal film according to the present invention; and FIG. 8 is an I-V curve of an ultra-thin metal film according to the present invention. As shown in FIG. 7, no clusters are formed in the ultra-thin metal film according to the present invention. As shown in FIG. 8, the I-V (current-voltage) curve observed by scanning tunneling spectroscopy (STS) shows metallic characteristics. In FIG. 8, the average of 100 curves measured at different points within the area of 50×50 nm$^2$ is shown. The deviation of the 100 curves was extremely small.

The observation was carried out within the bias-voltage range of −0.4 V to 0.4 V. At the same point (same voltage), the I-V (current-voltage) curve did not change even after repeated measurements of scanning tunneling spectroscopy (STS).

Figure 9:
FIG. 9 is a scanning tunneling microscope (STM) image showing a state wherein metal atoms aggregate to form a cluster.
Figure 10:
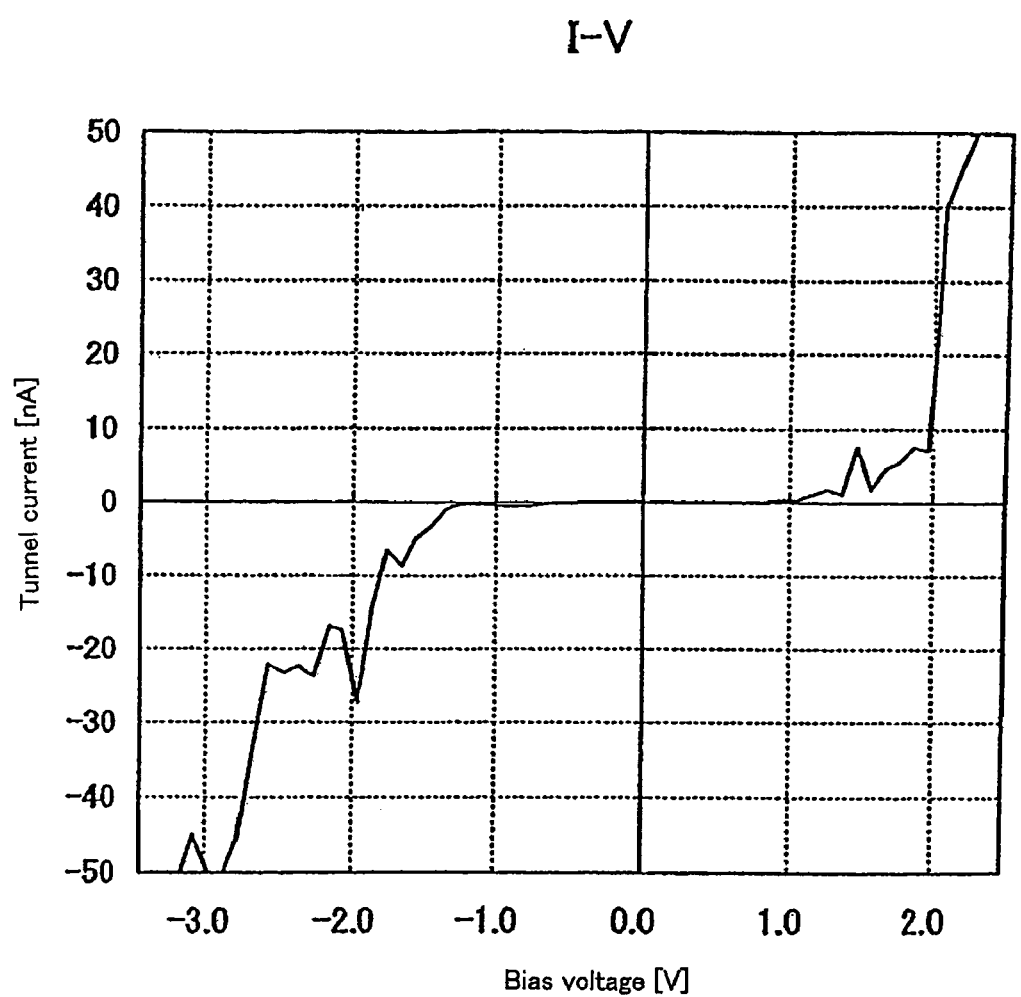
FIG. 10 is an I-V curve of a peripheral portion of a state wherein a cluster is formed.

However, when the bias voltage was scanned from −5 V to 5 V, a dramatic change occurred in the I-V curve. After the bias voltage was scanned 5 times from −5 V to 5 V, the scanning tunneling microscope (STM) image is shown in FIG. 9, and the I-V curve in the vicinity of a Pt cluster is shown in FIG. 10. As shown in FIG. 9, a Pt cluster appears when a strong electric field is applied. The Pt cluster was about 30 nm in diameter and 6 to 8 m in thickness. Namely, a large number of Pt atoms are migrated and aggregated by a strong electric field to form a Pt cluster. As a result, as seen in FIG. 10, an insulating region appears around the Pt cluster.

Figure 11:
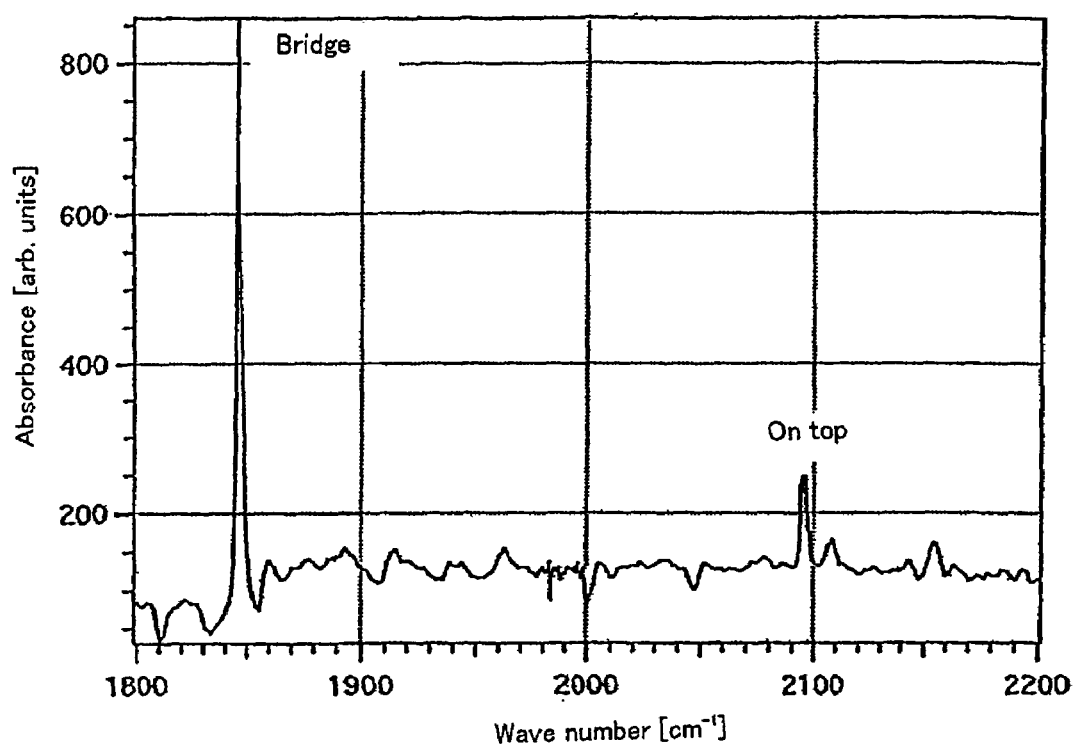
FIG. 11 is an infrared absorption spectrum of CO adsorbed on an ultra-thin Pt film (monatomic film) for $\alpha\text{-}Al_2O_3$.

In order to examine the metallurgical characteristics of the ultra-thin Pt film formed on the α-Al$_2$O$_3$/Ru (0001) face, the infrared absorption spectrum by reflection method (RAIRS) of adsorbed CO was measured. The result is shown in FIG. 11.

The infrared absorption spectrum was obtained by a Fourier transform infrared absorption spectrometer. In the present invention, the vibrational spectrum of CO is effective to the ultra-thin Pt film formed on the α-Al$_2$O$_3$/Ru (0001) face, and CO was adsorbed and the spectrum was measured at 80K.

Figure 12:
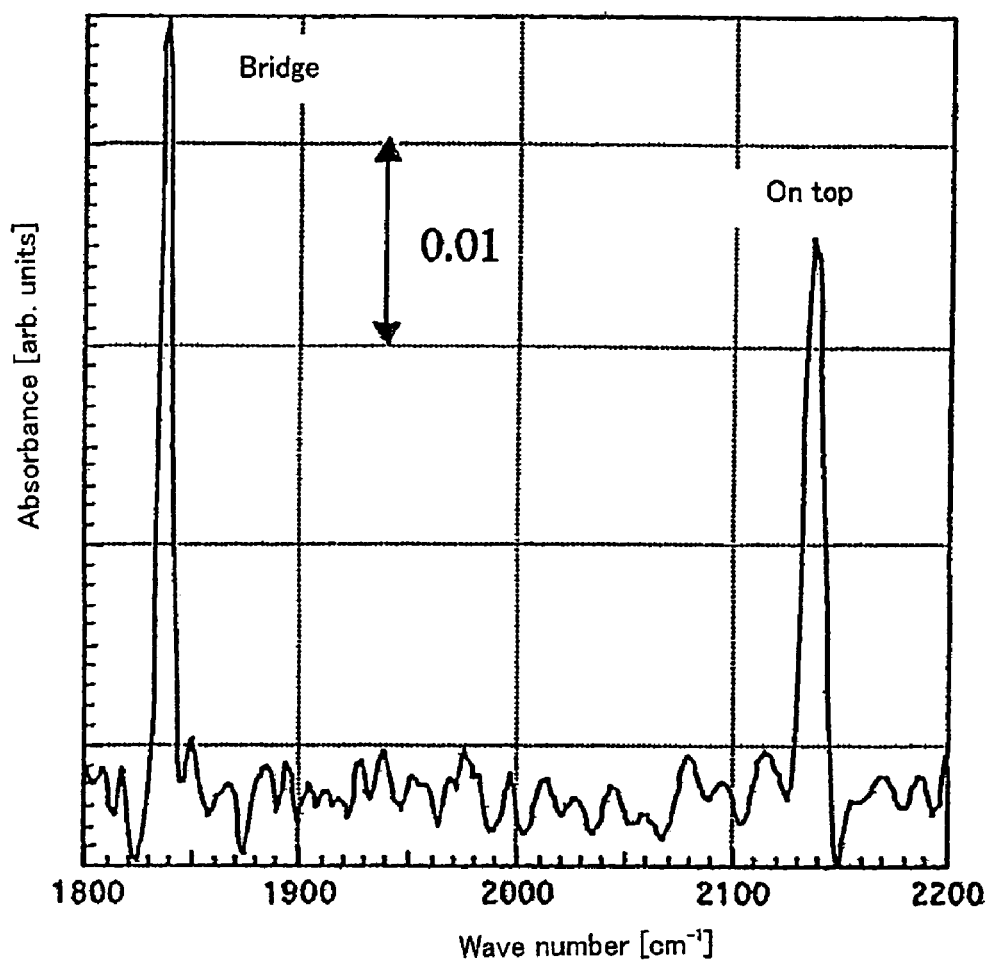
FIG. 12 is an infrared absorption spectrum of CO adsorbed on an ultra-thin Pt film (5-atomic film) for $SiO_2$.
Figure 13:
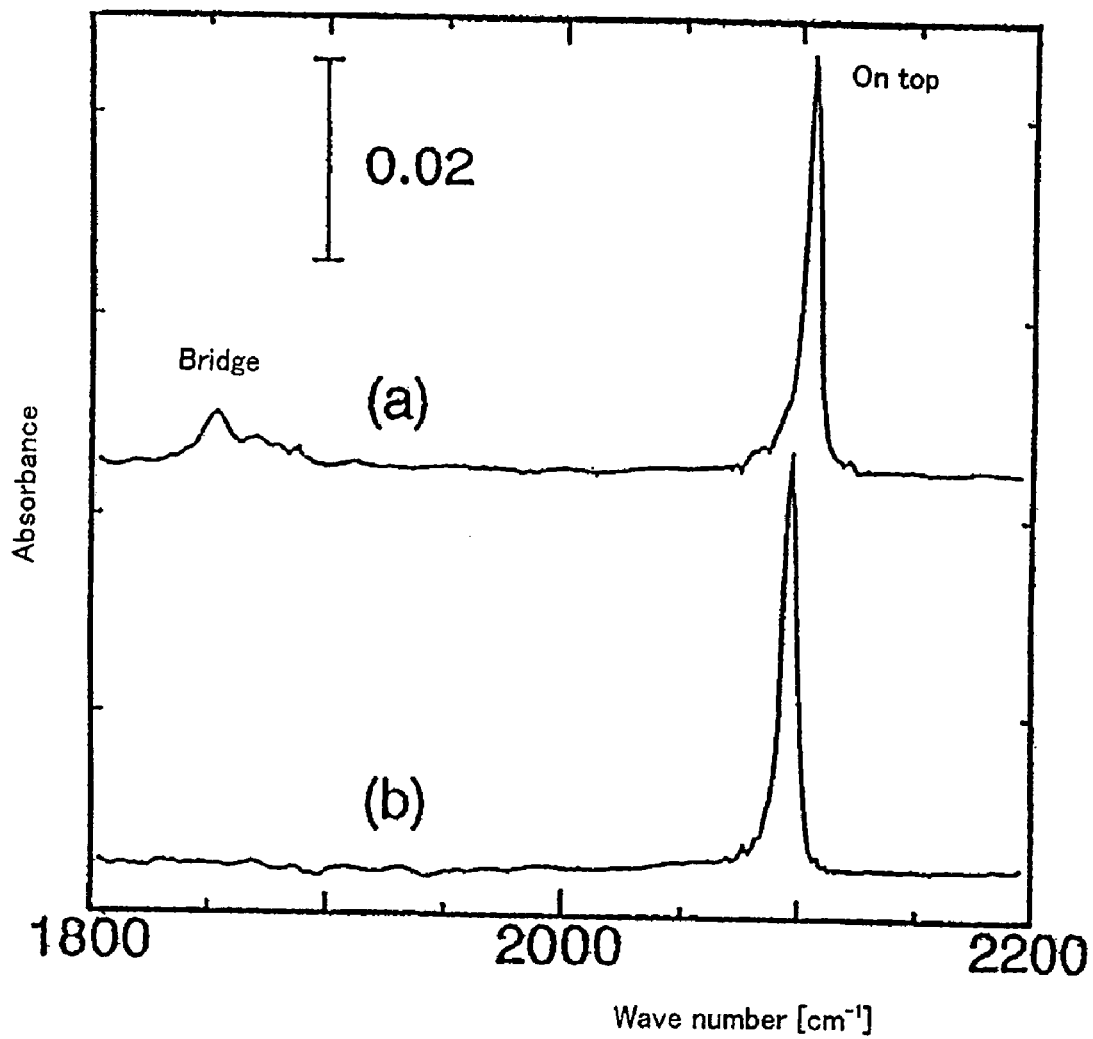
FIG. 13(a) is an infrared absorption spectrum of CO on Pt (111)
FIG. 13(b) is an infrared absorption spectrum of CO on Pt (111)-Ge.
Figure 14:
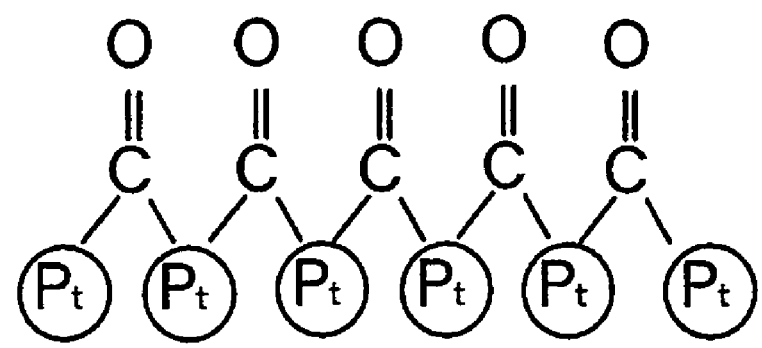
FIG. 14 is a schematic drawing for illustrating the bridge site and on-top site of CO.
Figure 14:
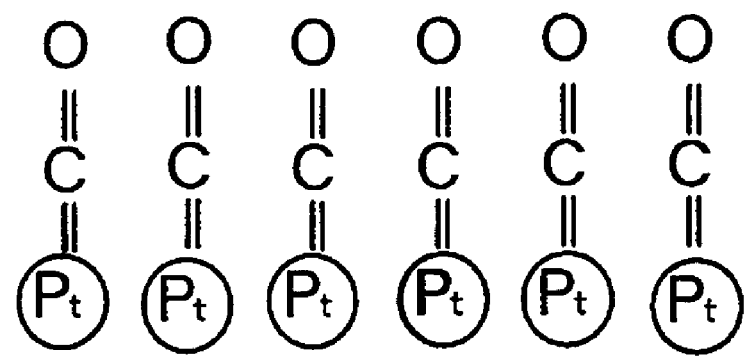

Next, the bridge and the on top as the adsorption site of CO will be described based on FIGS. 11 to 14. Here, FIG. 11 is an infrared absorption spectrum of CO on an ultra-thin Pt film (monatomic film) for an α-Al$_2$O$_3$ substrate; FIG. 12 is an infrared absorption spectrum of CO on an ultra-thin Pt film (5-atomic film) for SiO$_2$ substrate; FIG. 13(a) is an infrared absorption spectrum of CO on Pt (111); FIG. 13(b) is an infrared absorption spectrum of CO on Pt (111)-Ge face alloy; and FIG. 14 is a diagram for illustrating the bridge site and the on-top site of CO. The CO adsorption site on the Pt surface observed by reflection absorption infrared spectrum (RAIRS) is significantly different from the CO adsorption site on the Pt (111) face and the Pt (111)-Ge face alloy. In the normal case, that is Pt (111), a large number of CO adsorption sites are on-top sites, and the CO adsorption on the Pt (111)-Ge face alloy is only on-top sites. Whereas in the ultra-thin Pt film CO adsorbed on the bridge sites is the predominant species.

It is considered that the phenomenon of the CO adsorption sites in this example is caused by the electronic properties. According to observation by scanning tunneling microscope (STM) and low-energy electron diffraction (LEED), since the Pt—Pt distances are random, if the adsorption site is considered to be caused by a geometric origin, the structure of the bridge site is considered undesirable. From two causes of the symmetry of the d-orbital and the interaction of the d-orbitals of Pt and Ru, in the Pt monatomic film, the bridge site is considered to be more stable than the on-top site.

For a face-centered cubic Pt atom, five d-orbitals in an O$_h$ point group is divided into an e$_g$(d$_{x^2-y^2}$ and d$_{3z^2-r^2}$) orbital and a t$_{2g}$(d$_{xy}$, d$_{yz}$ and d$_{zx}$) orbital, where x, y and z are coordinates parallel to the elementary lattice vector of a cubic lattice.

On the other hand, in the D$_{3d}$ point group in a monatomic layer of a Pt atom, the t$_{2g}$ orbital in an O$_h$ point group is divided into an e$_g$(d$_{yz}$ and d$_{zx}$) and an a$_{1g}$(d$_{xy}$) orbital, and the e$_g$(d$_{x^2-y^2}$ and d$_{3z^2-r^2}$) orbital does not change.

Five d-orbitals in the D$_{3d}$ point group are divided into two e$_g$ orbitals and one a$_{1g}$ orbital, and the two e$_g$ orbitals are mixed because they have the same symmetry. When the atom arrangement of bonding adsorbed on the Pt (111) face is examined, new axes, x', y' and z' must be taken in the three directions of [112], [110] and [111], respectively.

The σ-bonding of the bridge site in CO adsorption is formed by the d$_{y'z'}$ orbital in the y'-z' (or z'-x') face. This is represented by $(2d_{x^2-y^2}-d_{yz}+d_{zx})/\sqrt{6}$. Thus, the contribution of the e$_g$ orbital to the σ-bonding becomes dominant, and on the other hand, the σ-bonding of the on-top site is affected by the t$_{2g}$ orbital. However, in the case of a D$_{3d}$ point group, CO adsorption on the bridge site is affected by the e$_g$ orbital (for example, d$_{x^2-y^2}$, d$_{yz\ and\ dzx}$). Therefore, the bridge site is considered to be the predominant adsorption site of CO.

As also shown in FIG. 11, the predominant adsorption site of CO to a Pt monatomic film is the bridge site. In this case, it is considered that the d-hole density of Pt increases due to the interaction with the d-band of Ru in the substrate, holes are formed in the e$_g$ orbital, and the bridge site becomes the predominant adsorption site. Therefore, increase in the d-hole density suggests the possibility to promotet a catalytic activity that a metal other than Pt can substitute Pt.

Here, a Pt catalyst has extremely high oxidation ability in the reaction of CO and $H_2$ similar to Pd and the like, and is widely used as the exhaust-gas purifying catalyst (three-way catalyst) for motor vehicles. Although a Pt catalyst is used as a catalyst for fuel cells, when the quantity of CO adsorbed on the surface of the Pt catalyst increases, the catalytic activity is reduced and the life is shortened.

As also shown in FIG. 12, the on-top site appears significantly in the 5-atom multilayered film of Pt. However, the wave number of the absorption of the on-top site is about 40 $cm^{-1}$ larger than the wave number of CO adsorbed on bulk Pt, or the case of FIG. 11. This shows that the density of d-holes increases, the electron transfer from Pt to the $\pi^*$orbital of CO decreases, the bonding of CO to Pt is weakened, and CO is easily removed. As a result, it is considered that the 5-atom multilayered film of Pt is protected from being poisoned due to CO compared with bulk Pt, and the life of the catalyst of fuel cells can be extended.

INDUSTRIAL APPLICATION

According to the present invention, an ultra-thin metal film or a film wherein ultra-thin metal films are multilayered can be obtained without forming clusters. Therefore, the thickness of Pt, Pd and the like, used as the catalyst for fuel cells, the catalyst for cleaning exhaust gas and the like, can be reduced to 1/10 or less than in conventional methods; and the life as the catalyst can be extended, resulting in significant cost reduction.

In addition, since a continuous ultra-thin metal film can be obtained, the thickness of the gate electrode composing an integrated circuit can be made thin to several nanometers, the density of the integrated circuit can further be elevated. Application to the magnetic head or the like of a hard-disk drive can also be considered.

Furthermore, the present invention is based on extremely interesting findings, and the uses thereof are not limited to catalysts or semiconductor devices, but applications to every use can be considered.

What is claimed is:

1. A monoatomic metal film in which single atoms form a two-dimensionally continuous film, wherein the monoatomic metal film is formed on a surface of a metal base material, in a state where a thin dielectric single-crystal film having a band-gap width which is narrower than a band-gap width in the normal state, is interposed between the metal base material and the monoatomic metal film.

2. The monoatomic metal film according to claim 1, wherein the film thickness of the thin dielectric film is a film thickness whereby the valence electrons and holes of the metal composing the base material and the monoatomic metal film are affected by a many-body effect.

3. The monoatomic metal film according to claim 1 or 2, wherein the base material whereon the thin dielectric film is formed, is composed of a single-crystal metal whose lattice constant is close to the lattice constant of the dielectric.

4. The monoatomic metal film according to claim 3, wherein the metal that composes the monoatomic metal film is selected from metals including Pt (platinum), Pd (palladium), Ni (nickel), Ti (titanium), Au (gold), Ag (silver), Cu (copper), Al (aluminum), Zn (zinc), Co (cobalt), Mn (manganese), Mo (molybdenum), W (tungsten), Re (rhenium), Ru (ruthenium) and Rh (rhodium); a Pt—Ru system, a Pt—Pd system, a Pt—Rh system, a Pt—Ni system, a Pt—Cr system, a Pt—Co system, a Pt—Mo system, a Pt—Fe system, a Ni—Mo system, a Ni—Co system, a Ni—Mo—Co system, a Mo—Co system, a Fe—Cr system, a Cu—Zn system, a Cu—Cr system, a Cu—Ni system, a Zn—Cr system, a Zn—Al system, a Cd—Cu system, and a Cd—Zn system.

5. The monoatomic metal film according to claim 3, wherein the thin dielectric film is $Al_2O_3$, $SiO_2$, MgO, and AlN.

6. The monoatomic metal film according to claim 3, wherein the band gap in the normal state of the thin dielectric film is 5 eV or more.

7. The monoatomic metal film according to claim 3, wherein the base material is selected from the group consisting of Ru (ruthenium), Ni (nickel), Mo (molybdenum), Ta (tantalum), Ag (silver), Co (cobalt), and graphite.

8. The monoatomic metal film according to claim 7, wherein the base material is epitaxially grown on a surface of another metal, silicon, ceramic, or glass.

9. The monoatomic metal film according to claim 1 or 2, wherein the metal that composes the monoatomic metal film is selected from metals including Pt (platinum), Pd (palladium), Ni (nickel), Ti (titanium), Au (gold), Ag (silver), Cu (copper), Al (aluminum), Zn (zinc), Co (cobalt), Mn (manganese), Mo (molybdenum), W (tungsten), Re (rhenium), Ru (ruthenium) and Rh (rhodium); a Pt—Ru system, a Pt—Pd system, a Pt—Rh system, a Pt—Ni system, a Pt—Cr system, a Pt—Co system, a Pt—Mo system, a Pt—Fe system, a Ni—Mo system, a Ni—Co system, a Ni—Mo—Co system, a Mo—Co system, a Fe—Cr system, a Cu—Zn system, a Cu—Cr system, a Cu—Ni system, a Zn—Cr system, a Zn—Al system, a Cd—Cu system, and a Cd—Zn system.

10. The monoatomic metal film according to claim 1 or 2, wherein the thin dielectric film is any of $Al_2O_3$, $SiO_2$, MgO, and AlN.

11. The monoatomic metal film according to claim 1 or 2, wherein the band gap in the normal state of the thin dielectric film is 5 eV or more.

12. The monoatomic metal film according to claim 1 or 2, wherein the base material is selected from the group consisting of Ru (ruthenium), Ni (nickel), Mo (molybdenum), Ta (tantalum), Ag (silver), Co (cobalt), and graphite.

13. The monoatomic metal film according to claim 12, wherein the base material is epitaxially grown on a surface of another metal, silicon, ceramic, or glass.

14. A monoatomic metal multilayer film comprising monoatomic metal films layered in the thickness direction in which each monoatomic film is formed of single atoms in a two-dimensionally continuous film wherein the monoatomic metal multilayer film is formed on a thin dielectric single-crystal film having a band-gap width which is narrower than a band-gap width in the normal state that is formed on a metal base material.

15. The monoatomic metal multilayer film according to claim 14, wherein the film thickness of the thin dielectric film is a film thickness whereby the valence electrons and holes of the metal composing the base material and the monoatomic metal film are affected by a many-body effect.

16. The monoatomic metal multilayer film according to claim 14 or 15, wherein the base material whereon the thin dielectric film is formed, is composed of a single-crystal metal whose lattice constant is close to the lattice constant of the dielectric.

17. The monoatomic metal multilayer film according to claim 16, wherein the metal that composes the monoatomic metal film is selected from a metal or metal system selected from the group consisting of Pt (platinum), Pd (palladium), Ni (nickel), Ti (titanium), Au (gold), Ag (silver), Cu (copper), Al (aluminum), Zn (zinc), Co (cobalt), Mn (manganese), Mo (molybdenum), W (tungsten), Re (rhenium), Ru (ruthenium), Rh (rhodium); a Pt—Ru system, a Pt—Pd system, a Pt—Rh system, a Pt—Ni system, a Pt—Cr system, a Pt—Co system, a Pt—Mo system, a Pt—Fe system, a Ni—Mo system, a Ni—Co system, a Ni—Mo—Co system, a Mo—Co system, a Fe—Cr system, a Cu—Zn system, a Cu—Cr system, a Cu—Ni system, a Zn—Cr system, a Zn—Al system, a Cd—Cu system, and a Cd—Zn system.

18. The monoatomic metal multilayer film according to claim 16, wherein the thin dielectric film is selected from the group consisting of $Al_2O_3$, $SiO_2$, MgO and AlN.

19. The monoatomic metal multilayer film according to claim 16, wherein the band gap in the normal state of the thin dielectric film is 5 eV or more.

20. The monoatomic metal multilayer film according to claim 16, wherein the base material is selected from the group consisting of Ru (ruthenium), Ni (nickel), Mo (molybdenum), Ta (tantalum), Ag (silver), Co (cobalt), and graphite.

21. The monoatomic metal multilayer film according to claim 20, wherein the base material is epitaxially grown on a surface of another metal, silicon, ceramic, or glass.

22. The monoatomic metal multilayer film according to claim 14 or 15, wherein the metal that composes the monoatomic metal film is selected from a metal or metal system selected from the group consisting of Pt (platinum), Pd (palladium), Ni (nickel), Ti (titanium), Au (gold), Ag (silver), Cu (copper), Al (aluminum), Zn (zinc), Co (cobalt), Mn (manganese), Mo (molybdenum), W (tungsten), Re (rhenium), Ru (ruthenium), Rh (rhodium); a Pt—Ru system, a Pt—Pd system, a Pt—Rh system, a Pt—Ni system, a Pt—Cr system, a Pt—Co system, a Pt—Mo system, a Pt—Fe system, a Ni—Mo system, a Ni—Co system, a Ni—Mo—Co system, a Mo—Co system, a Fe—Cr system, a Cu—Zn system, a Cu—Cr system, a Cu—Ni system, a Zn—Cr system, a Zn—Al system, a Cd—Cu system, and a Cd—Zn system.

23. The monoatomic metal multilayer film according to claim 14 or 15, wherein the thin dielectric film is selected from the group consisting of $Al_2O_3$, $SiO_2$, MgO, and AlN.

24. The monoatomic metal multilayer film according to claim 14 or 15, wherein the band gap in the normal state of the thin dielectric film is 5 eV or more.

25. The monoatomic metal multilayer film according to claim 14 or 15, wherein the base material is selected from the group consisting of Ru (ruthenium), Ni (nickel), Mo (molybdenum), Ta (tantalum), Ag (silver), Co (cobalt), and graphite.

26. The monoatomic metal multilayer film according to claim 25, wherein the base material is epitaxially grown on a surface of another metal, silicon, ceramic, or glass.

27. A method of fabricating a monoatomic metal film or a monoatomic metal multilayer film comprising the steps of:
   forming a thin dielectric single-crystal film on a surface of a metal base material so as to have a film thickness whereby the band-gap width of the dielectric is narrower than the band-gap width in the normal state, and
   growing the monoatomic metal film to form a two dimensional continuous film having a thickness of a single atom on the thin dielectric single-crystal film by a deposition method.

28. The method of fabricating a monoatomic metal film or a monoatomic metal multilayer film according to claim 27, wherein the thin dielectric film is fabricated under the following conditions:
   (1) The surface of the base material whereon the thin dielectric film is formed is oriented to a preferred crystal face;
   (2) The surface on which the thin dielectric film is formed is cleaned;
   (3) A metal that composes the dielectric is vapor-deposited, and oxidized by heating in an oxygen atmosphere; and
   (4) A heat-treatment is performed to cause the phase transition of the dielectric film to a single-crystal film.

29. The method of fabricating a monoatomic metal film or a monoatomic metal multilayer film according to claim 27 or 28, wherein the monoatomic metal film is fabricated by vapor deposition, Chemical Vapor Deposition or Plasma Vapor Deposition.

* * * * *